United States Patent
Amemiya et al.

(10) Patent No.: US 11,143,728 B2
(45) Date of Patent: Oct. 12, 2021

(54) MAGNETIC RESONANCE IMAGING APPARATUS AND CONTROL METHOD THEREOF

(71) Applicant: Hitachi, Ltd., Tokyo (JP)

(72) Inventors: Tomoki Amemiya, Tokyo (JP); Suguru Yokosawa, Tokyo (JP); Yo Taniguchi, Tokyo (JP); Yoru Shirai, Tokyo (JP)

(73) Assignee: HITACHI, LTD., Tokyo (JP)

( * ) Notice: Subject to any disclaimer, the term of this patent is extended or adjusted under 35 U.S.C. 154(b) by 13 days.

(21) Appl. No.: 16/898,798

(22) Filed: Jun. 11, 2020

(65) Prior Publication Data

US 2021/0199741 A1    Jul. 1, 2021

(30) Foreign Application Priority Data

Dec. 26, 2019  (JP) .............................. JP2019-236884

(51) Int. Cl.
*G01R 33/483*  (2006.01)
*G01R 33/561*  (2006.01)

(52) U.S. Cl.
CPC ....... *G01R 33/4835* (2013.01); *G01R 33/561* (2013.01)

(58) Field of Classification Search
CPC .......................... G01R 33/4835; G01R 33/561
See application file for complete search history.

(56) References Cited

U.S. PATENT DOCUMENTS

| | | | |
|---|---|---|---|
| 10,261,153 B2 | 4/2019 | Bhat et al. | |
| 2012/0046539 A1* | 2/2012 | Visser | G01R 33/5602 600/410 |
| 2018/0128891 A1 | 5/2018 | Jeong et al. | |
| 2019/0277932 A1* | 9/2019 | Zeller | G01R 33/5602 |
| 2019/0357799 A1* | 11/2019 | Choi | A61B 5/0042 |

* cited by examiner

*Primary Examiner* — Gregory H Curran
(74) *Attorney, Agent, or Firm* — Mattingly & Malur, PC

(57) ABSTRACT

To provide an MRI apparatus that acquires a plurality of contrast images including an FLAIR image in the shortest imaging time. An imaging controller of the MRI apparatus includes, as a prescribed pulse sequence, an IR (inversion recovery) sequence that includes application of an inversion pulse and a signal acquisition sequence to collect a signal after an inversion time has elapsed from the application of the inversion pulse, and acquires images in a first slice group, and an imaging sequence that is inserted into an inversion pulse of the IR sequence at a single time and an inversion pulse of the IR sequence at the next time, and acquires images in a second slice group different from the first slice group that are images having different contrasts from that of the IR sequence.

11 Claims, 10 Drawing Sheets

MAGNETIC RESONANCE IMAGING APPARATUS AND CONTROL METHOD THEREOF

INCORPORATION BY REFERENCE

The present application claims priority from Japanese patent application JP-2019-236884 filed on Dec. 26, 2019, the content of which is hereby incorporated by reference into this application.

BACKGROUND OF THE INVENTION

Field of the Invention

The present invention relates to a technique of imaging by a magnetic resonance imaging apparatus (hereinafter, referred to as MRI apparatus), and more specifically relates to a technique of simultaneously acquiring a plurality of images having different contrasts including a FLAIR image.

Description of the Related Art

An imaging method called fluid attenuated inversion recovery (FLAIR) is one of imaging methods of MRI. In this imaging method, a high frequency pulse (IR pulse) that inverses a spin is applied, by using a difference in longitudinal relaxation time between a spin of water and a spin of fat, at a timing when the spins of water are only transverse magnetized, a pulse sequence for measurement of a signal, for example, a pulse sequence such as FSE is executed, and echo signals in which signals from the spins of water are suppressed are measured. A waiting time (TI) from the IR pulse to the signal measurement is longer than the signal measurement time, so that in order to effectively use the waiting time, multi-slice imaging in which the IR pulse and the signal measurement are successively performed by varying slice positions is typically performed.

However, an interval between an IR pulse and an IR pulse depends on the signal measurement time, the interval to some extent is required in the signal measurement, for example, in a case where 10 to 20 echoes are intended to be measured. In other words, the utilization of the waiting time TI is limited.

Meanwhile, an examination in which an MRI apparatus is used is requested to acquire not only one contrast image, but also a plurality of contrast images including a proton density weighted (PDW) image, a T1 weighted (T1W) image, and a T2 weighted (T2W) image. For such a request, for example, USP No. 10,261,153 B2 (PTL 1) proposes an imaging method in which FLAIR and T2W imaging are combined. In this method, after an IR pulse is applied to one slice, by using a fast spin echo (FSE) sequence that simultaneously excites a plurality of slices, an FLAIR image and a T2W image are simultaneously acquired.

Moreover, US 2018/0128891 A1 (PTL 2) discloses a technique in which, in FLAIR for multi-slices, after IR pulses for a plurality of slices, during the time from the first application of the IR pulses to the signal measurement, T2 weighted imaging or the like is performed with respect to a slice different from the slices excited by FLAIR.

SUMMARY OF THE INVENTION

In the technique described in PTL 1, there is an advantage of acquiring two types of images in one imaging. However, the reduction of time is limited because the waiting time TI of the IR sequence is not utilized.

The technique described in PTL 2 satisfies two requests of the utilization of the waiting time in the abovementioned FLAIR and the simultaneous acquisition of a plurality of contrast images. However, the time between IR pulses corresponding to the signal measurement time still remains as a waiting time, and the reduction effect of the imaging time as a whole is thus limited.

The present invention addresses the problem of providing a technique that solves the abovementioned conventional problems, and acquires a plurality of contrast images including an FLAIR image in the shortest imaging time.

To solve the abovementioned problems, contrast imaging at a plurality of times is performed by utilizing an interval between IR pulses in the present invention. In this case, slice positions are controlled to minimize influences of RF pulses that are respectively used in the temporarily adjacent imaging.

In other words, an MRI apparatus according to a first aspect of the present invention includes: an imaging unit that collects a nuclear magnetic resonance signal generated by an examination object, and acquires an image of the examination object; and an imaging controller that controls the imaging unit using a pulse sequence, in which the pulse sequence includes a pulse sequence in which a plurality of imaging sequences that respectively acquire a plurality of images having different contrasts are combined, and one imaging sequence among the imaging sequences is an IR (inversion recovery) sequence including application of an inversion pulse and a signal acquisition sequence that collects a signal after an inversion time has elapsed from the application of the inversion pulse, the imaging controller executes the IR sequence at a plurality of times with respect to a plurality of slices while shifting application timing of the inversion pulse of the IR sequence, and executes, between the inversion pulse of the IR sequence at a single time and the inversion pulse of the IR sequence at the next time, the imaging sequence different from the IR sequence with respect to a different slice from the slices to which the two inversion pulses have been applied.

Moreover, an MRI apparatus according to a second aspect of the present invention includes: a static magnetic field generation unit; a gradient magnetic field generation unit that provides a gradient magnetic field to a static magnetic field; a transmitter that generates a high frequency pulse; and a receiver that receives a nuclear magnetic resonance signal, the magnetic resonance imaging apparatus causing the gradient magnetic field generation unit, the transmitter, and the receiver to operate in accordance with a prescribed pulse sequence and acquiring an image of an examination object, in which the prescribed pulse sequence includes an IR (inversion recovery) sequence that includes application of an inversion pulse and a signal acquisition sequence to collect a signal after an inversion time has elapsed from the application of the inversion pulse, and acquires images in a first slice group, and an imaging sequence that is inserted into an inversion pulse of the IR sequence at a single time and an inversion pulse of the IR sequence at the next time, and acquires images in a second slice group different from the first slice group that are images having different contrasts from that of the IR sequence.

DETAILED DESCRIPTION OF THE INVENTION

Hereinafter, an embodiment of an MRI apparatus according to the present invention will be described.

Figure 1:
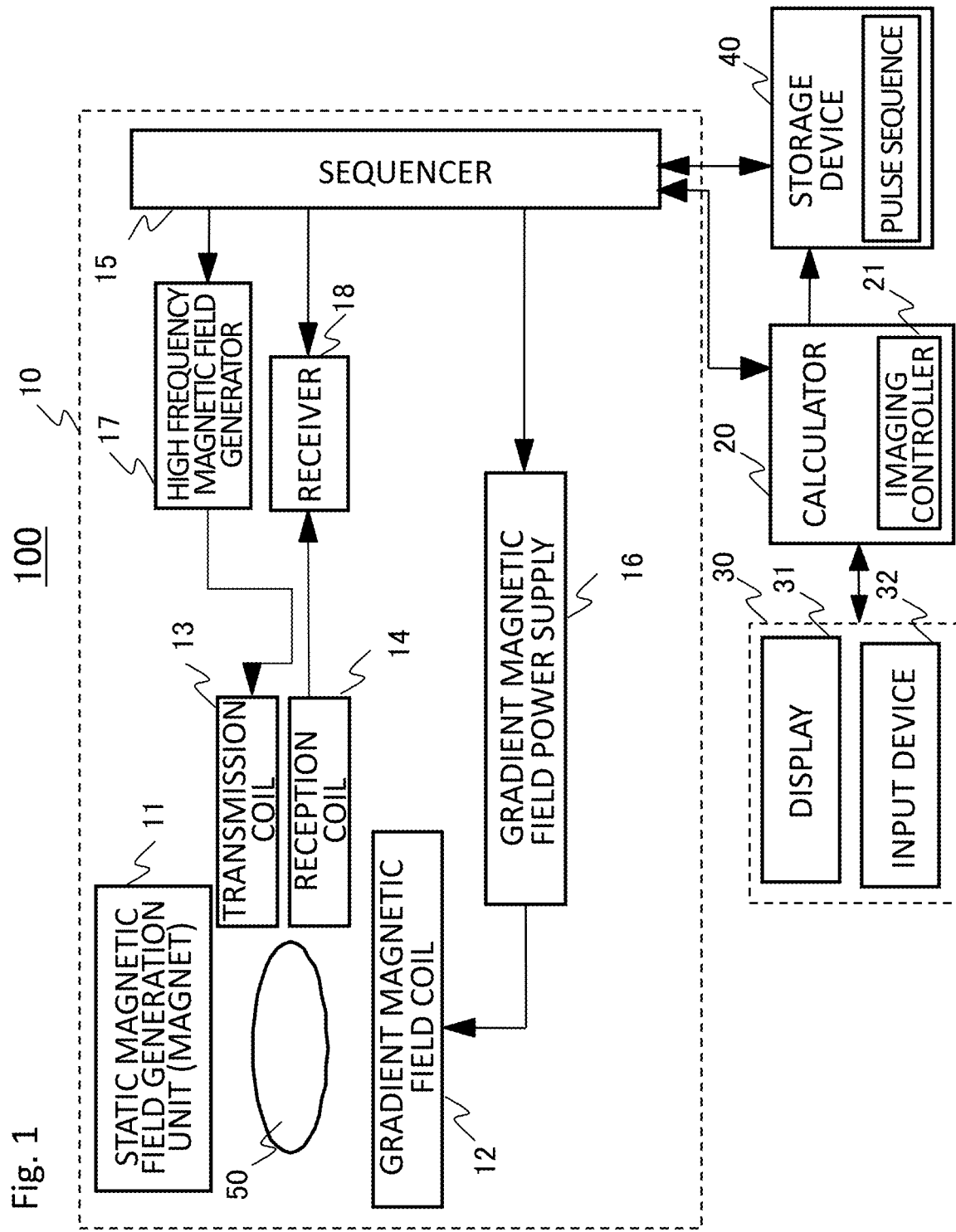
FIG. 1 is a diagram illustrating an entire configuration of an MRI apparatus to which the present invention is applied.

An overview of the MRI apparatus to which the present invention is applied will firstly be described. As illustrated in FIG. 1, an MRI apparatus 100 is provided with an imaging unit 10, and a calculator 20 that performs various kinds of computations using signals collected by the imaging unit 10 and control of the overall apparatus, as a main configuration.

The imaging unit 10 is provided with a magnet 11 that generates a static magnetic field, a gradient magnetic field coil 12 that provides a magnetic field gradient to the static magnetic field, an RF transmission coil 13 that generates a high frequency magnetic field, an RF reception coil 14 that receives a nuclear magnetic resonance signal, and a sequencer 15.

The magnet 11, which includes a horizontal magnetic field type and a vertical magnetic field type in accordance with the direction of a static magnetic field to be generated, generates a uniform magnetic field in an examination space in which an subject 50 is placed. The gradient magnetic field coil 12 is coupled to a gradient magnetic field power supply 16, and generates a gradient magnetic field. The gradient magnetic field coil 12 includes three coils that generate gradient magnetic fields in three mutually perpendicular axes directions, and can generate a gradient magnetic field in an arbitrary direction by combining the gradient magnetic fields generated by the gradient magnetic field coil 12.

The RF transmission coil 13 is coupled to a high frequency magnetic field generator 17, and emits (transmits) a high frequency magnetic field to the subject 50. The RF reception coil 14 is coupled to a receiver 18, and receives a nuclear magnetic resonance signal from the subject (examination object) 50. The gradient magnetic field coil 12 applies a gradient magnetic field in a prescribed direction at prescribed timing during when a nuclear magnetic resonance signal is generated and received, thereby making it possible to apply information on a phase encode, a frequency encode, and the like to the nuclear magnetic resonance signal.

The sequencer 15 sets a magnetic resonance frequency serving as a reference of detection to the receiver 18, and respectively sends commands and operates the gradient magnetic field power supply 16, the high frequency magnetic field generator 17, and the receiver 18, in accordance with an instruction from the calculator (PC) 20.

The calculator 20 receives the signal detected by the receiver 18 via an A/D conversion circuit, performs signal processing such as image reconstruction, and causes a display device or the like to display a result thereof. The calculator 20 can include a general-purpose calculator or workpiece station that is provided with a CPU, a GPU, and a memory, and functions thereof are implemented as software that the CPU executes by reading a program stored in a storage unit. Note that, the signal processing and part of the computation can be implemented as hardware such as ASIC and FPGA, and the calculator 20 in the present embodiment includes the hardware.

To the calculator 20, coupled are a user interface (UI) unit 30 for interactively controlling the apparatus with a user, and a storage device 40 (including an internal storage device and an external storage device of the calculator) that stores therein programs and data necessary for the computation and the control in the calculator 20. The UI unit 30 is provided with a display 31 that displays an image and a GUI serving as a computation result of the calculator 20, and an input device 32 that receives a command from the user.

Imaging by the imaging unit 10 is performed in accordance with a pulse sequence set in the sequencer 15 and an imaging parameter input via the UI unit 30.

The pulse sequence in which the intensity and the application timing of an RF pulse generated by the RF transmission coil 13 and a gradient magnetic field pulse generated by the gradient magnetic field coil 12, and the signal collection time in the receiver 18 are defined, includes various kinds of pulse sequences in accordance with the imaging methods and the imaging purposes, and these pulse sequences are stored in advance in the storage device 40.

The imaging parameter includes an echo time (TE), a repetition time (TR), a slice thickness, the number of slices, and the like. The user sets a pulse sequence or an imaging parameter in accordance with a property value that the user intends to image in a weighted manner (for example, a longitudinal relaxation time (T1), a transverse relaxation time (T2), an apparent transverse relaxation time (T2*), a proton density (PD), a diffusion coefficient, and the like) to make it possible to image various kinds of images having mutually different degrees of enhancement in terms of a difference in the property value (for example, a T1 weighted image, a T2 weighted image, a T2* weighted image, a proton density weighted image, a diffusion weighted image, and the like), that is, images having different contrasts.

The calculator 20 sets, in accordance with an user instruction input via the UI unit 30, a prescribed pulse sequence and a prescribed imaging parameter to the sequencer 15, and controls the imaging unit 10 via the sequencer 15. The function of the calculator 20 is implemented as an imaging controller 21.

In the present embodiment, as a pulse sequence, a pulse sequence that performs multi-slice imaging by combining an imaging sequence (IR sequence) using an inversion pulse (IR pulse) that inverts vertical magnetization and an imaging sequence that acquires an image having a different contrast from that of the IR sequence is set. In the multi-slice imaging, a measurement space in which signals received by the receiver are stored for each slice is prepared in the memory of the calculator 20. In addition, in the present embodiment, measurement spaces in which signals collected by the IR sequence and signals collected by the imaging sequence of the different contrast are respectively stored are prepared for each slice, and echo signals that are successively collected by the execution of each imaging sequence are stored in the corresponding measurement space for each slice and for each sequence type.

First Embodiment

Hereinafter, an embodiment of a pulse sequence executed by an MRI apparatus according to the present embodiment and a control method thereof will be described.

Figure 2:
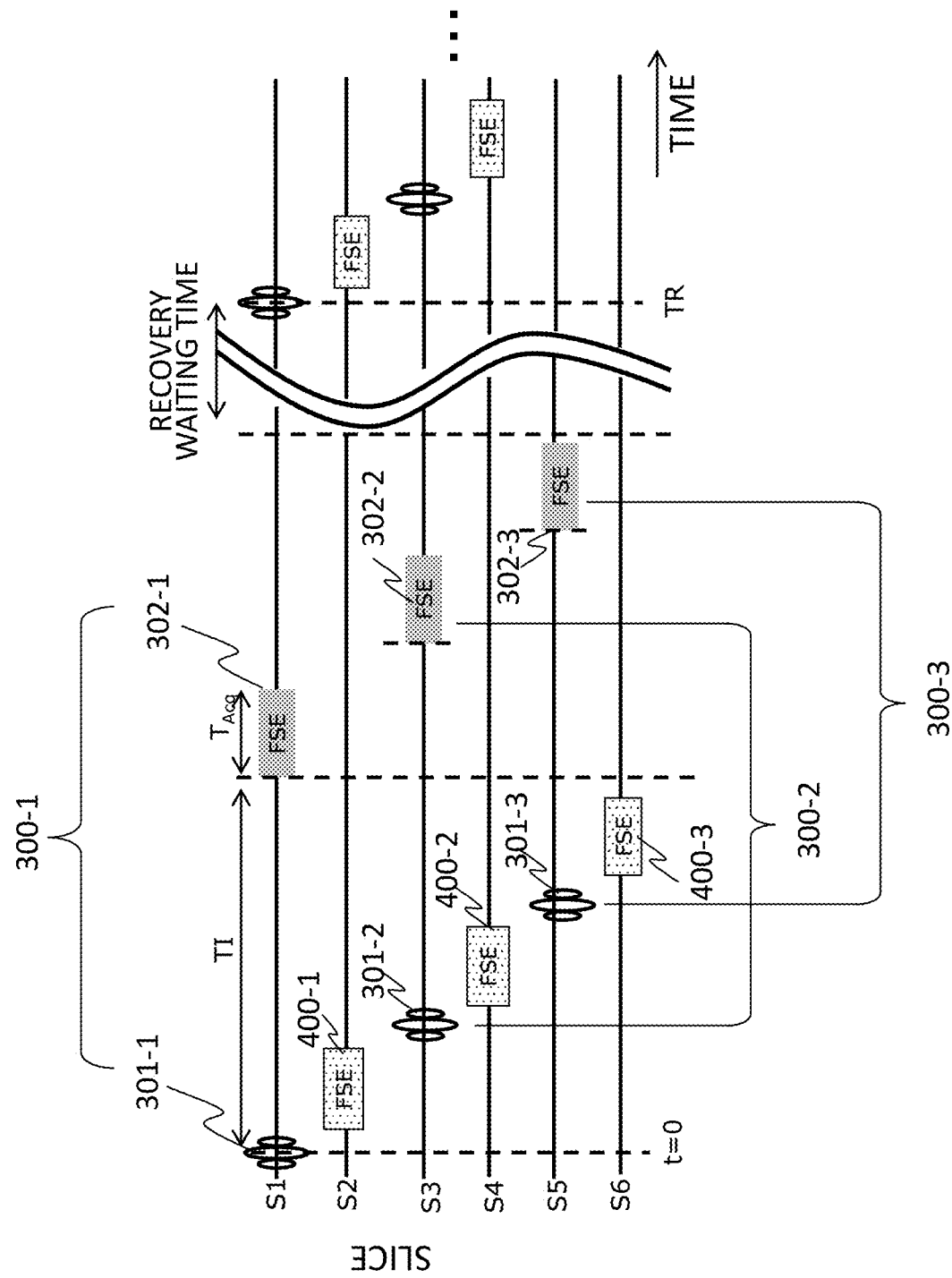
FIG. 2 is a diagram illustrating one example of a pulse sequence executed by an MRI apparatus in a first embodiment.

FIG. 2 illustrates one example of a for multi-slice pulse sequence executed by the MRI apparatus in the present embodiment. The pulse sequence includes an FLAIR sequence 300, and an imaging sequence 400 that acquires an image, for example, a T2 weighted image, having a different contrast from that of the FLAIR sequence 300, and alternately executes the FLAIR sequence 300 and the imaging sequence 400 while switching slices. Note that, a case where the number of slices is 6 is illustrated in the drawing. The reference numeral "-1" in the drawing is used to indicate a difference among the slices as targets, and is omitted in the general explanation (the same applies hereinafter).

Specifically, in the FLAIR sequence 300, a slice S1 is firstly selected and an IR pulse 301-1 is then applied thereto, a signal acquisition sequence 302-1 is executed after a prescribed TI time has elapsed from the application, and an echo signal from the slice S1 is collected. The signal acquisition sequence 302 is not specially limited as long as a sequence that acquires an echo signal, and is preferably a sequence of a fast spin echo method or an echo planar method that can collect a plurality of echo signals after one exciting RF pulse.

Figure 3:
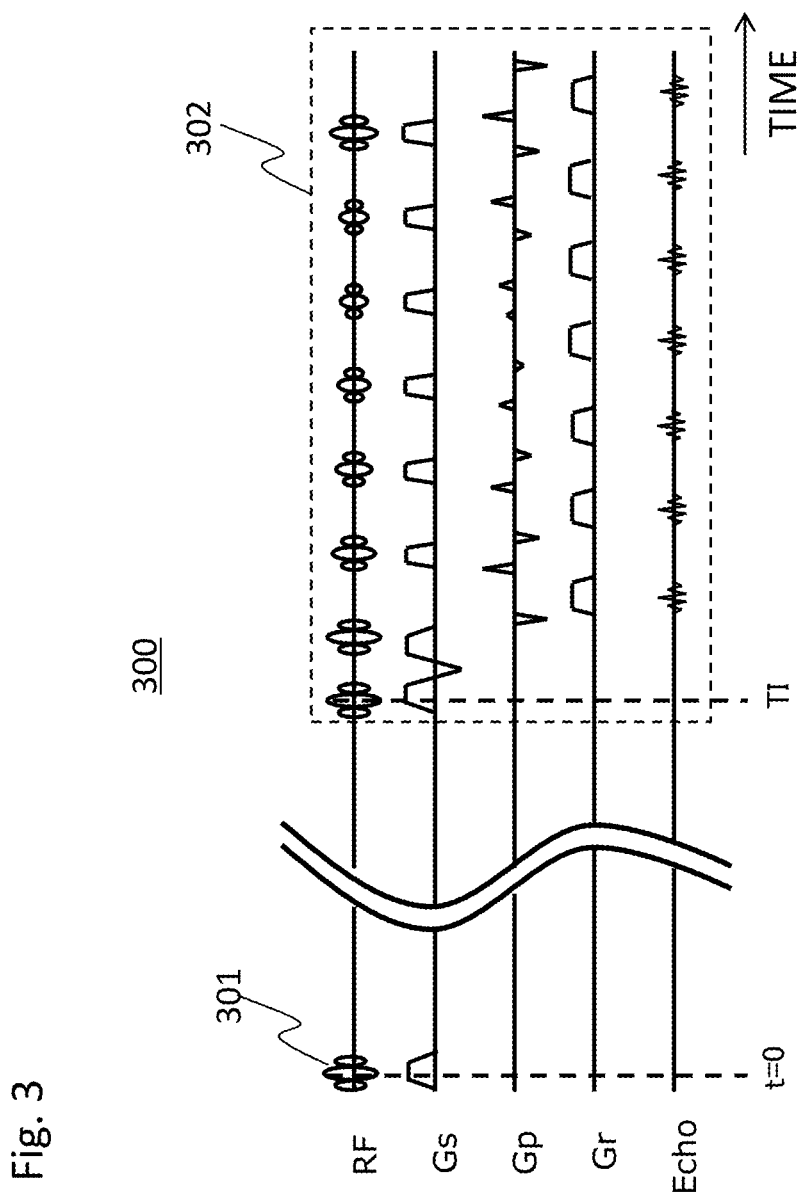
FIG. 3 is a diagram illustrating an FLAIR sequence in an imaging sequence of FIG. 1.

FIG. 3 illustrates one example of the FLAIR sequence 300. In this imaging sequence, the IR pulse 301 is applied with a slice gradient magnetic field pulse Gs to inverse the vertical magnetization (nuclear spin) in a prescribed slice. A desired slice can be selected based on the direction and the intensity of the slice gradient magnetic field pulse. After the elapse of the TI time from when the IR pulse 301 has been applied, the signal acquisition sequence 302 is started. In the example illustrated in FIG. 3 of the signal acquisition sequence 302 that is a sequence of the fast spin echo (FSE) method, the same slice is firstly selected and an exciting RF pulse (for example, 90-degree pulse) is applied thereto, and while repeatedly applying a refocusing RF pulse (for example, 180-degree pulse) for generating an echo signal Echo thereafter, a reading gradient magnetic field pulse Gr is applied between the refocusing RF pulse and the refocusing RF pulse to measure the echo signal Echo. Before the application of the reading gradient magnetic field pulse Gr, a phase encode gradient magnetic field pulse Gp the intensity of which is different for each echo signal is applied to impart a phase encode to the echo signal. Note that, as the refocusing RF pulse, in addition to the 180-degree pulse, a pulse by a variable flip angle method that modulates the flip angle at an angle smaller than 180 degrees can be used.

After the signal acquisition for the slice S1 has been performed, the application of an IR pulse 301-2 and a signal acquisition sequence 302-2 are executed similarly also to a slice S3, between the first application of the IR pulse 301-1 and the second application of the IR pulse 301-2, a slice S2 different from the slices S1 and S3 is selected, and an imaging sequence 400-1 is executed thereto.

The imaging sequence 400 is a sequence that acquires an images having a different contrast, and the type of the sequence is not limited, however, similar to the signal acquisition sequence 302, is preferably a sequence that can collect a plurality of echo signals after one exciting RF pulse. The number of echo signals to be acquired during one signal collection time is set to be the same, so that two types of images, an FLAIR image and an image having a different contrast can be acquired for each slice with the same repetition, and the measurement can be performed with high efficiency. Note that, in accordance with the type of the imaging sequence 400, an imaging sequence such as a spin echo method sequence or a gradient echo method sequence that collects one or a small number of echoes at one excitation may be employed.

In the imaging sequence 400, by changing the type (for example, the FSE method, the echo planar method, the spin echo method, or the gradient echo method) of the pulse sequence or sorting (ordering) the application order of the phase encode gradient magnetic fields, the degree of weighting is varied, thereby making it possible to acquire images having different contrasts, for example, a T1 weighted image, a T2 weighted image, a T2* weighted image, a proton density weighted image, a diffusion weighted image, and the like.

Specifically, in a case where the imaging sequence 400 is a sequence similar to the signal acquisition sequence 302 illustrated in FIG. 3, a proton density weighted image is obtained in an ordering in which an echo signal (minimum phase encode) that is disposed in the center of a k space is firstly collected. Moreover, as the example of FIG. 3, in a case where the timing when the echo signal is collected is delayed, a T2 (or T2*) weighted image is obtained. A T1 weighted image is typically imaged using the spin echo sequence, in the case of the present embodiment, in order to eliminate of an influence by the IR pulse of the adjacent slice, a 90-degree pulse that makes the vertical magnetization be zero is applied, and after a fixed waiting time (TR'), FSE similar to the signal acquisition sequence of FIG. 2 may be executed. The degree of recovery of the vertical magnetization due to the waiting time (TR') is adjusted, thereby making it possible to obtain a T1 weighted image in which the degree of the T1 weighting is adjusted. As for a diffusion weighted image, a signal is collected by applying a gradient magnetic field pulse having a large intensity, called MPG pulse, similar to the T2 weighted image.

The abovementioned the imaging sequence 400 is executed between an IR pulse 301-1 and an IR pulse 301-2 (FIG. 2). Herein, an interval between the IR pulse of the former FLAIR sequence and the IR pulse of the latter FLAIR sequence is determined based on the time ($T_{ACQ}$) of the signal acquisition sequence 302 (in other words, the IR pulse interval needs to be the time ($T_{ACQ}$) or longer), so that the time ($T_{ACQ}$) of the signal acquisition sequence 302 and the time of the imaging sequence 400 are respectively required to be shorter than the IR pulse interval. Meanwhile, the necessary time for imaging becomes shorter as the number of collection times of echoes for one excitation is more, so that it is preferable to make each of the time of the signal acquisition sequence 302 and the time of the imaging sequence 400 longer within a range that satisfies the condition, and make the number of echo collection times more. More preferably, the IR pulse interval, the time of the signal acquisition sequence 302, and the time of the imaging sequence 400 are set so as to be approximately equal to maximize the number of collection times of echoes per time, thereby obtaining a large reduction effect of the imaging time.

Also for the slice S5, similar to the slices S1 and S3, the application of an IR pulse 301-3 and a signal acquisition sequence 302-3 are executed, between the second IR pulse 301-2 and a third IR pulse 301-3, a slice S4 is selected, and an imaging sequence 400-2 is executed thereto. Moreover, after the application of the IR pulse 301-3 to the slice S5, a slice S6 is selected and an imaging sequence 400-3 is executed thereto.

The pulse sequence is repeated using the above repetition unit after the recovery time of the vertical magnetization is waited, until echo signals necessary for the image reconstruction are respectively acquired by the signal acquisition sequence 302 and the imaging sequence 400. Accordingly, signals for FLAIR images are collected for the slices S1, S3, and S5, and signals for images such as a T1W image or a PDW image having a different contrast from that of the FLAIR image are collected for the slices S2, S4, and S6.

Next, a slice that is a target of the FLAIR sequence 300 and a slice that is a target of the imaging sequence 400 are switched, and the pulse sequence in FIG. 2 is repeated. Accordingly, FLAIR images are obtained for the slices S2, S4, and S6, and images having a different contrast are obtained for the slices S1, S3, and S5. Two types of images are eventually obtained for all the slices.

With the present embodiment, in the multi-slice imaging using IR pulses, between temporarily continuous two IR pulses (between an IR pulse of a IR sequence at a single time and an IR pulse of a IR sequence at the next time), a sequence to acquire an image having a different contrast is conducted with respect to a slice different from the slices to which the IR pulses are respectively applied, thereby making it possible to acquire several types of images within the imaging time of the multi-slices using the IR pulses, without the time extension. Moreover, the waiting time of the last slice is not only used, so that it is possible to set the number of slices in which TI is sufficiently utilized.

Note that, in the above explanation, FLAIR is used as an example of a sequence that uses the IR pulse, in addition to FLAIR, a sequence such as double inversion recovery (DIR) in which an IR pulse is applied twice to the same slice or short time inversion recovery (STIR) in which a signal is collected in a comparatively short TI may be used.

Figure 4A:
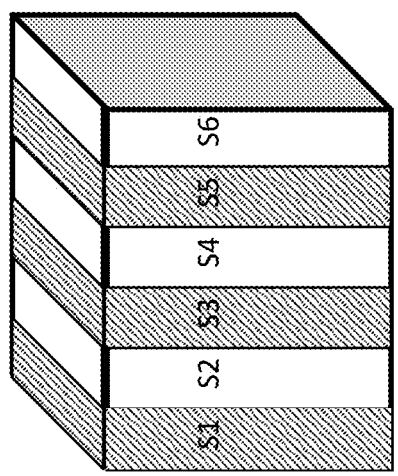
FIGS. 4A and 4B are diagrams for explaining an imaging order of slices in the first embodiment and a second embodiment, respectively.

Moreover, in FIG. 2, as illustrated in FIG. 4A, the example has been indicated in which a plurality of slices are divided into two groups of slices having odd numbers and slices having even numbers, the FLAIR sequence 300 for one group and the imaging sequence 400 for another contrast for the other group are alternately executed, however, the order of the slices S1 to S6 is not limited to the example in FIG. 2 as long as the slices S1 to S6 are different from one another. Note that, FLAIR sequences that are temporarily adjacent to each other are preferably executed to slices that are not spatially adjacent to each other in order to eliminate the influence by the previous IR pulse on the adjacent slice.

The order of the slices may be set as the default with the imaging sequences illustrated in FIG. 2, or may be configured to be controlled by the imaging controller 21 in accordance with imaging parameters such as the number of slices and the slice thickness.

Second Embodiment

The present embodiment is the same as that in the first embodiment in that between temporarily continuous two IR pulses of FLAIR sequences, an imaging sequence of a different contrast is executed and a plurality types of images are acquired for a short time, however, in the present embodiment, the order of slices is controlled, and an influence of the IR pulse having been applied to the near slice is eliminated as much as possible, thereby improving the image quality.

In other words, in the present embodiment, a region including a plurality of slices of an examination object is divided into first and second regions, a first measurement (measurement block 1) in which the slices to which temporarily adjacent inversion pulses are applied are set as the slices included in the first region and the slices to which a different imaging sequence is executed are set as the slice included in the second region, and a second measurement (measurement block 2) in which the slices to which temporarily adjacent inversion pulses are applied are set as the slice included in the second region and the slices to which the different imaging sequence is executed are set as the slices included in the first region, are executed.

In this case, the slices included in the first region and slice included in the second region are respectively divided into the slices having the odd numbers and the slices having the even numbers, and the first measurement and the second measurement are respectively and separately executed to the slices having the odd numbers and the slices having the even numbers in a separate manner.

Figure 4B:
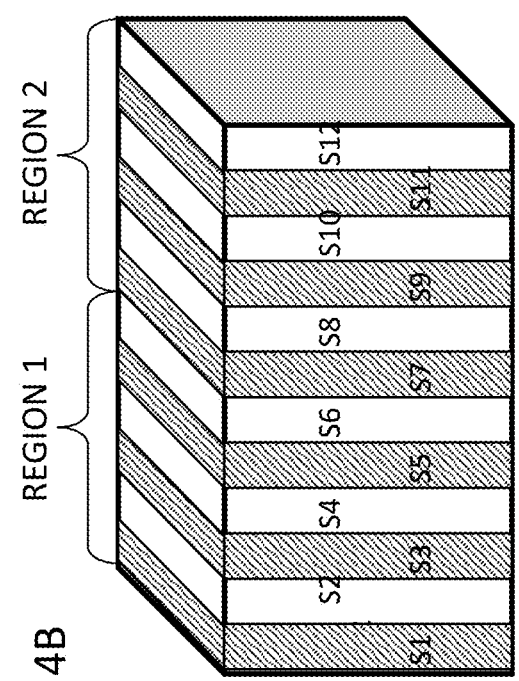
Figure 5:
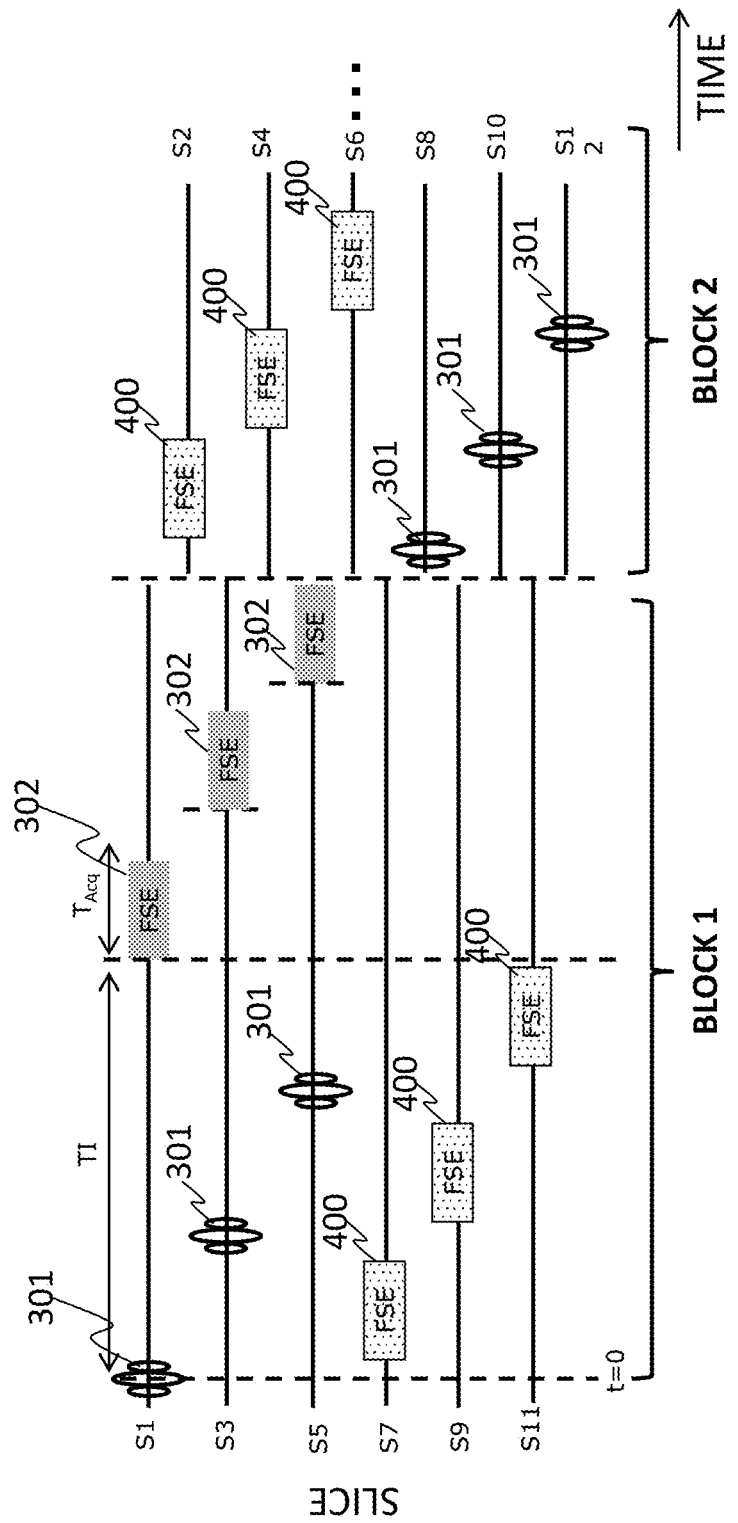
FIG. 5 is a diagram illustrating one example of a pulse sequence in the second embodiment.

FIG. 5 illustrates one example of a pulse sequence in the present embodiment. Herein, as illustrated in FIG. 4B, an example in which 12 slices are multi-slice imaged is indicated. The details of the FLAIR sequence 300 and the imaging sequence 400 constituting the pulse sequence have been already described in the first embodiment, and explanations thereof are omitted herein.

In the present embodiment, as illustrated in the drawing, the FLAIR sequence 300 is executed to the slices S1, S3, and S5 having the odd numbers included in the first region, while successively shifting the application timing of the IR pulse 301 and the signal acquisition sequence 302.

The imaging sequence 400 to acquire an image having a different contrast from that of the FLAIR image is executed to the slices S7, S9, and S11 of the odd number in the second region, respectively, between imaging of the slice S1 and imaging of the slice S3, between the imaging of the slice S3 and imaging of the slice S5, and after the application of an IR pulse to the slice S5. The measurement up to here is set as the block 1.

Next, the slices S8, S10, and S12 having the even numbers included in the second region are selected, and the FLAIR sequence 300 is executed thereto while successively shifting the application timing of the IR pulse 301 and the signal acquisition sequence 302. The slices S2, S4, and S6 having the even numbers in the first region are selected, and the imaging sequence 400 to acquire an image having a different contrast from that of the FLAIR image is executed thereto respectively between imaging of the slice S8 and imaging of the slice S10, between the imaging of the slice S10 and imaging of the slice S12, and after the application of an IR pulse to the slice S12. The measurement up to here is set as the block 2.

Next, the slices having the odd numbers and the slices of the even numbers are switched, and the measurement of the block 1 and the measurement of the block 2 are similarly performed. In other words, in the block 1, signals for FLAIR images are collected in the slices S2, S4, and S6 having the even numbers in the first region, and signals for another contrast image are collected in the slices S8, S10, and S12 having the even numbers in the second region. In the block 2, signals for FLAIR images are collected in the slices S7, S9, and S11 having the odd numbers in the first region, and signals for another contrast image are collected in the slices S1, S3, and S5 having the odd numbers in the second region.

Figure 6:
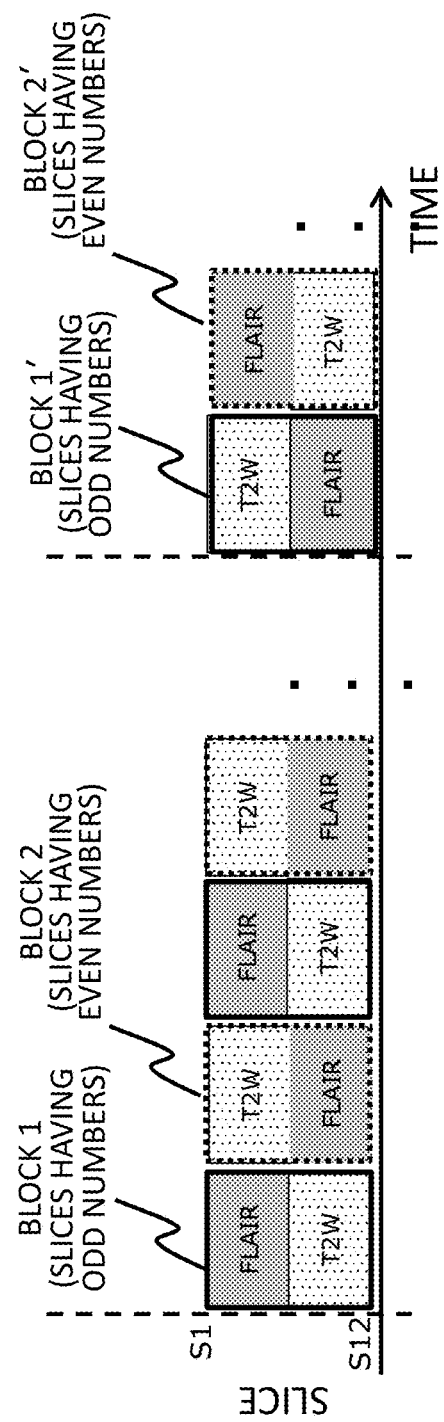
FIG. 6 is a diagram for explaining a slice measurement order in the second embodiment.

In other words, as illustrated in FIG. 6, a first measurement of the block 1 and the block 2 and a second measurement of the block 1 (1') and the block 2 (2') in which the slices having the odd numbers and the slices having the even numbers are switched are performed, whereby the FLAIR sequence 300 and the imaging sequence 400 for another contrast are executed for all the slices. In a case where it is set to collect echo signals of the number necessary for the reconstruction of an image in a single sequence, images of two types are obtained for all the slices. Alternatively, two measurements are repeated as a set, images of two types are obtained for all the slices.

In the foregoing, the case where the number of slices is 12 has been indicated, however, the order of slices can be controlled with the same method in a case where the number of slices is more than or less than 12.

With the present embodiment, similar to the first embodiment, the slice to which the IR pulse of the FLAIR sequence is applied is not adjacent to the slice to which the IR pulse has been applied immediately prior thereto, thereby obtaining an FLAIR image having a good image quality and receiving no influence of the IR pulse having been applied to the adjacent slice. Moreover, with the present embodiment, a slice to which the FLAIR sequence is performed and a slice to which a sequence of another contrast is performed are slices in the different regions, so that it is also possible for another contrast image to eliminate the influence of the IR pulse having been applied to the adjacent slice and to improve the image quality.

Third Embodiment

In the present embodiment, in the IR sequence at a plurality of times, between the application of adjacent inversion pulses, imaging sequences of several types having mutually different contrasts are executed.

Figure 7:
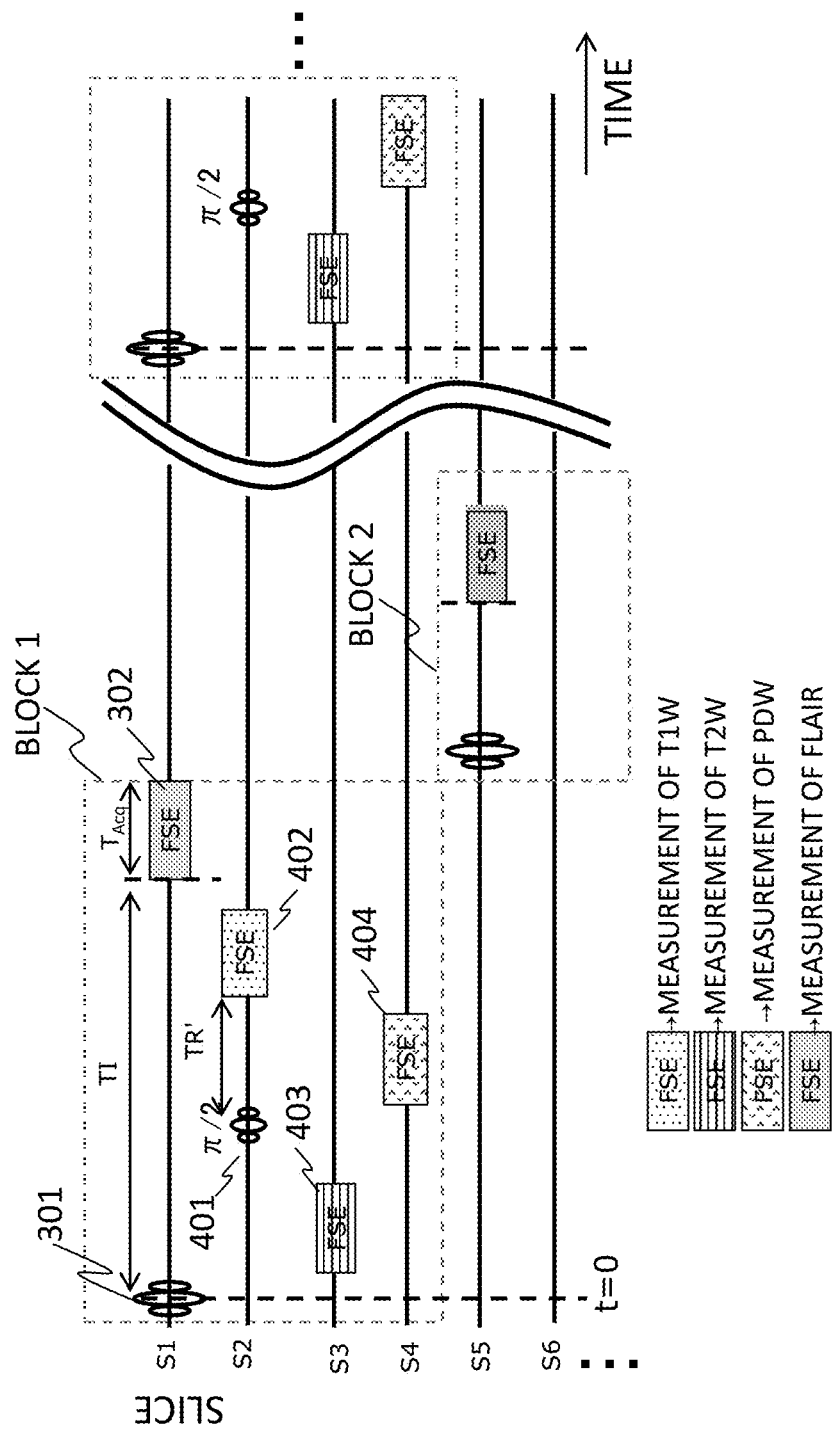
FIG. 7 is a diagram illustrating one example of a pulse sequence in a third embodiment.

FIG. 7 illustrates one example of a pulse sequence in the present embodiment. In the drawing, the same reference numerals are given to the same elements as those in FIGS. 2 and 5, and explanations thereof are omitted.

In the present embodiment, the measurement of four slices is set as one block, and the measurement is repeated, an FLAIR image and images of three types having contrasts different from that of the FLAIR image are acquired.

In a first block 1, until the signal acquisition sequence 302 after the slice S1 is selected and the IR pulse 301 of the FLAIR sequence 300 is applied thereto, imaging sequences 402, 403 and 404 to respectively acquire three types of images having mutually different contrasts are executed with respect to slices S2, S3, and S4. Herein, a case where the imaging sequences are three types of a T1W image acquiring sequence (abbreviated as T1W sequence), a T2W image acquiring sequence (abbreviated as T2W sequence), and a PDW image acquiring sequence (abbreviated as PDW sequence) will be described as an example.

In the illustrated example, the slice S3 is selected and the T2W sequence 403 is executed thereto to acquire a signal from the slice S3, and the slice S4 is next selected and the PDW sequence 404 is executed thereto to acquire a signal from the slice S4. Moreover, after the T2W sequence 403 has ended and before the PDW sequence 404 starts, the slice S2 is selected and a pre-pulse (n/2 pulse) 401 is applied thereto, after a prescribed waiting time TR', a signal is acquired by the T1W sequence 402 from the slice S2. In other words, the PDW sequence 404 is executed during the waiting time TR' of the T1W sequence 402. Thereafter, the signal acquisition sequence 302 of the FLAIR sequence 300 is executed, and a signal is acquired from the slice S1.

Figure 8:
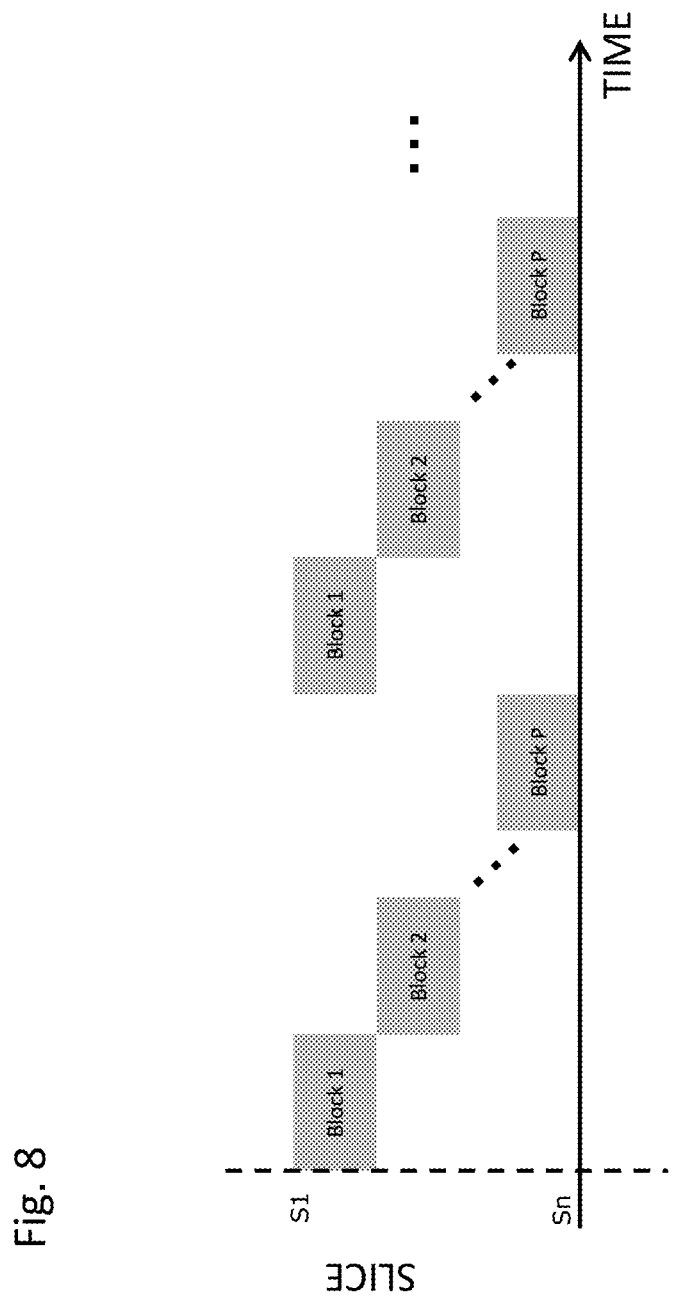
FIG. 8 is a diagram for explaining a slice measurement order in the third embodiment.

In the next block, with respect to four slices of the slices S5 to S8, similar to the above, the FLAIR sequence 300 and three types of the imaging sequences 402 to 404 are executed. After the measurement using four slices as one set has ended for all the slices (in other words, when the slice number of the slice having the maximum number in the block exceeds the number of all the slices, the block is set as a last block), the measurement is repeated for the blocks of the same number while the combination of the slices in the block is not changed but the order thereof is shifted. For example, while the imaging sequences 300, and 402 to 404 are performed in the order of the slices S1, S2, S3, and S4 in the block 1 at the first measurement, the imaging sequences 300 and 402 to 404 are performed in the order of the slices S2, S3, S4, and S1 in the block 1 at the next measurement. The same applies to the next block 2. FIG. 8 illustrates a state of such the slice control. In the drawing, the measurements of the blocks 1 to P (P is an integer of 2 or more) is repeated while changing the order of slices in the block. This allows images having all the contrasts to be measured for all the slices.

With the present embodiment, an increase in the types of the imaging sequences that are executed between the IR pulses to allow a large number of image types at once to be acquired, thereby further reducing the examination time. Moreover, in the present embodiment, T1W in which the imaging time is long in combination with the pre-pulse (n/2 pulse) can be incorporated between the IR pulses, so that it is possible to acquire the FLAIR image in which the imaging time is generally long and the T1W image by one imaging sequence, and the time reduction effect is high. In addition, in the present embodiment, by utilizing the time between the pre-pulse 401 of the T1W sequence in combination with the pre-pulse and the signal acquisition sequence 402, it is possible to execute several types of imaging sequences without extending the imaging time.

Note that, the case where signals of three images having mutually different contrasts are acquired between the IR pulses has been illustrated in FIG. 7, however, needless to say, the images may have two types, and arbitrary combinations thereof such as T2W and PDW, T2W and T1W, and T1W and PDW may be employed. Moreover, in FIG. 7, the T2W sequence 403 and the PDW sequence 404 may be switched. In addition, among the three sequences 402 to 404, the number of echo signals to be collected by two sequences, which are set as the sequences of the same type, is set to be less than, for example, a half of, the number of echo signals to be collected by the other one sequence.

Fourth Embodiment

The present embodiment is characterized in that as one of one or several types of imaging sequences having different contrasts in combination with the IR sequences, the T1W sequence is employed, and the pre-pulse (n/2 pulse) of T1W is applied as a composite pulse with the IR pulse.

Figure 9:
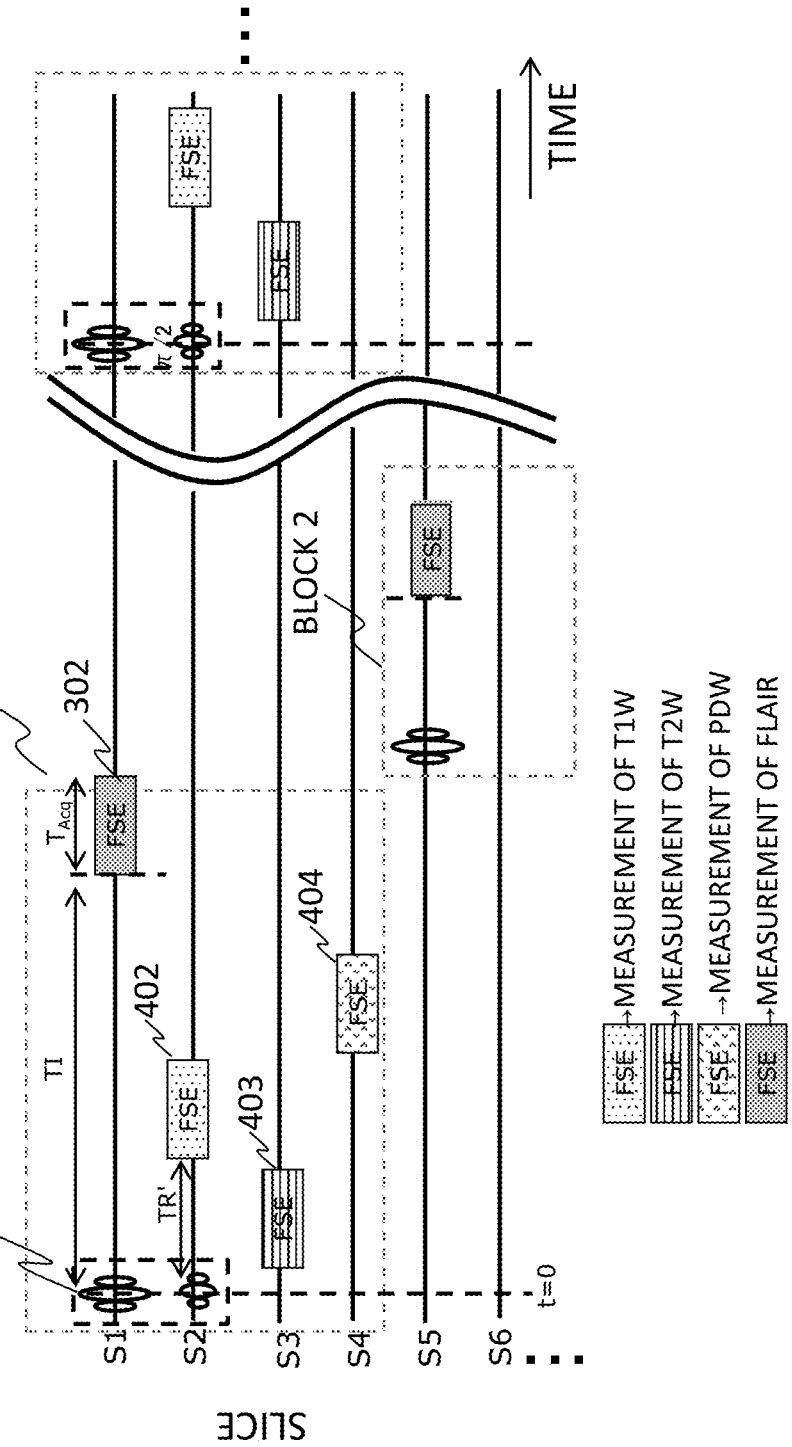
FIG. 9 is a diagram illustrating one example of a pulse sequence in a fourth embodiment.

FIG. 9 illustrates one example of a pulse sequence in the present embodiment. In FIG. 9, similar to the third embodiment, the measurement of four slices is set as one block, and the measurement is repeated, an FLAIR image and images of three types having different contrasts from that of the FLAIR image are acquired. Note that, in the present embodiment, as an RF pulse 301M to be applied first, a multiband pulse having a frequency for selecting the slice S1 and a frequency for selecting the slice 2 is used to rotate the vertical magnetization of the slice S1 and the vertical magnetization of the slice S2. In that case, by making the intensity (FA) of each frequency component different, the vertical magnetization of the slice S1 is rotated by 180 degrees, and the vertical magnetization of the slice S2 is rotated by 90 degrees.

Thereafter, with respect to the slice S1, the signal acquisition sequence 302 is executed after the prescribed TI, and during the TI, the signal acquisition sequence 402 is executed to the slice S2 after a waiting time TR'. Moreover, during the waiting time TR', the slice S3 is selected and a sequence of another contrast, a T2W or PDW sequence 403 is executed thereto, during the time from the end of the signal collection of the slice S2 to the signal collection of the slice S1, the slice S4 is selected and a sequence of still another contrast is executed thereto.

Similar to the third embodiment, the measurements of these four slices are set as one block, the similar measurement is performed with respect to the slice S5 and the subsequent slices, and the similar measurement is repeated by changing the order of the slices in the block.

With the present embodiment, the IRpulse 301 of the FLAIR sequence and the n/2 pulse 401 of the T1W sequence 402 are set as one multiband pulse, thereby obtaining an effect of reducing the imaging time by one pulse, compared with a case where the IR pulse 301 and the n/2 pulse 401 are separately applied.

Note that, the case where the imaging sequences of three types acquire images having different contrasts has been illustrated in FIG. 9, however, the present embodiment is applicable to a case where the imaging sequence is only the T1W sequence 402, and a case where in addition to the T1W sequence 402, only one of the imaging sequences 403 and 404 is included.

In the foregoing, the present embodiments of the pulse sequence executed by MRI apparatus in the present invention and the slice control has been described, however, the selection of the imaging sequence and the slice control method are set at the apparatus side using one or a plurality of combinations in accordance with an examination site and an examination purpose as the default, or may be configured to be controlled by the imaging controller 21 with a user designation.

Figure 10:
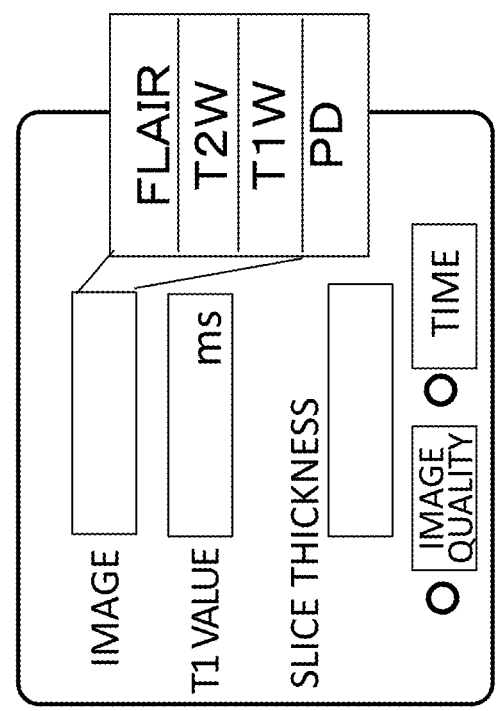
FIG. 10 is a diagram illustrating a UI screen example.

Examples of the user designation include the TI time in the IR sequence, the type and the number of desired images, the number of slices, the priority of the image quality or the measurement time, which may be used so as to be capable of being selected or input as imaging parameters when an imaging condition is set, as illustrated in FIG. 10. When receiving a user designation via the UI unit 30, the imaging controller 21 calculates and sets a pulse sequence and a slice control method in accordance with the user designation to the sequencer 15. For example, in a case where the image types by the user designation are FLAIR and T2W, the imaging controller 21 sets the imaging sequence as illustrated in FIG. 5, and determines a measurement order of slices. In that case, the imaging controller 21 may adjust, in accordance with the set TI and the set number of slices, the number of slices to be measured in one block and the number of acquired signals by the sequence 400 of another contrast.

In a case where the FLAIR image and images of other three types are input by the user designation, the imaging controller 21 may set the imaging sequences illustrated in FIG. 7 or 9, and adjust the number of acquired signals of the sequences 402 to 404 in accordance with the length of the input TI.

REFERENCE SIGNS LIST

10: imaging unit, 11: static magnetic field generation unit, 12: gradient magnetic field coil, 13: transmission coil, 14: reception coil, 20: calculator, 21: imaging controller, 30: UI unit, 40: storage device.

What is claimed is:

1. A magnetic resonance imaging apparatus comprising:
an imaging unit that collects a nuclear magnetic resonance signal generated by an examination object, and acquires an image of the examination object; and an imaging controller that controls the imaging unit using a pulse sequence, wherein
the pulse sequence includes a pulse sequence in which a plurality of imaging sequences that respectively acquire a plurality of images having different contrasts are combined, and one imaging sequence among the imaging sequences is an IR (inversion recovery) sequence including application of an inversion pulse and a signal acquisition sequence that collects a signal after an inversion time has elapsed from the application of the inversion pulse, and
the imaging controller executes the IR sequence at a plurality of times with respect to a plurality of slices while shifting application timing of the inversion pulse of the IR sequence, and
executes, between the inversion pulse of the IR sequence at a single time and the inversion pulse of the IR sequence at the next time, the imaging sequence different from the IR sequence with respect to a different slice from the slices to which the two inversion pulses have been applied.

2. The magnetic resonance imaging apparatus according to claim 1, wherein the imaging controller performs control of setting the two slices to which the two inversion pulses are applied as slices that are not spatially adjacent to each other.

3. The magnetic resonance imaging apparatus according to claim 2, wherein
the imaging controller executes
a first measurement in which the plurality of slices are divided into slices having odd numbers and slices having even numbers, temporarily adjacent inversion pulses are applied to the slices having odd numbers, the different imaging sequence is executed to the slices having even numbers, and
a second measurement in which the temporarily adjacent inversion pulses are applied to the slices having even numbers, and the different imaging sequence is executed to the slices having odd numbers.

4. The magnetic resonance imaging apparatus according to claim 1, wherein
the imaging controller executes
a first measurement in which a region of the examination object including the plurality of slices are divided into first and second regions, the IR sequences are executed to the slices included in the first region, and the different imaging sequence is executed to the slices included in the second region, and
a second measurement in which the IR sequences are executed to the slices included in the second region, and the different imaging sequence is executed to the slices included in the first region.

5. The magnetic resonance imaging apparatus according to claim 4, wherein the imaging controller divides the slices included in the first region and the slices included in the second region respectively into the slices having odd numbers and the slices having even numbers, and the first measurement and the second measurement are respectively and separately executed to the slices having odd numbers and the slices having even numbers.

6. The magnetic resonance imaging apparatus according to claim 1, wherein the imaging controller executes imaging sequences of several types having mutually different contrasts between the inversion pulse of the IR sequence at the single time and the inversion pulse of the IR sequence at the next time.

7. The magnetic resonance imaging apparatus according to claim 6, wherein the imaging sequences of the several types include any of a T1 weighted sequence, a T2 weighted sequence, a T2* weighted sequence, a proton density weighted sequence, and a diffusion weighted sequence.

8. The magnetic resonance imaging apparatus according to claim 1, wherein the IR sequence is any of an FLAIR sequence, an STIR sequence, and a DIR sequence.

9. The magnetic resonance imaging apparatus according to claim 1, wherein the signal acquisition sequence in the IR sequence and at least one of the imaging sequences having the contrasts different from that of the IR sequence is a sequence to measure a plurality of echo signals after one excitation.

10. A magnetic resonance imaging apparatus comprising: a static magnetic field generation unit; a gradient magnetic field generation unit that provides a gradient magnetic field to a static magnetic field; a transmitter that generates a high frequency pulse; and a receiver that receives a nuclear magnetic resonance signal, the magnetic resonance imaging apparatus causing the gradient magnetic field generation unit, the transmitter, and the receiver to operate in accordance with a prescribed pulse sequence and acquiring an image of an examination object, wherein the prescribed pulse sequence includes an IR (inversion recovery) sequence that includes application of an inversion pulse and a signal acquisition sequence to collect a signal after an inversion time has elapsed from the application of the inversion pulse, and acquires images in a first slice group, and an imaging sequence that is inserted into an inversion pulse of the IR sequence at a single time and an inversion pulse of the IR sequence at the next time, and acquires images in a second slice group different from the first slice group that are images having different contrasts from that of the IR sequence.

11. A control method of a magnetic resonance imaging apparatus that acquires an image of an examination object in accordance with a prescribed pulse sequence, wherein the prescribed pulse sequence includes an IR (inversion recovery) sequence that includes application of an inversion pulse and a signal acquisition sequence to collect a signal after an inversion time has elapsed from the application of the inversion pulse, and acquires images in a first slice group, and an imaging sequence that is inserted into an inversion pulse of the IR sequence at a single time and an inversion pulse of the IR sequence at the next time, and acquires images in a second slice group different from the first slice group that are images having different contrasts from that of the IR sequence, and the IR sequence and the imaging sequence are repeated by switching the first slice group and the second slice group, and control to acquire an IR image and an image having a different contrast from that of the IR image for all the slices included in the first slice group and the second slice group.

* * * * *